(12) United States Patent
Gambino et al.

(10) Patent No.: US 10,978,415 B2
(45) Date of Patent: Apr. 13, 2021

(54) SEMICONDUCTOR PACKAGE HAVING MAGNETIC INTERCONNECTS AND RELATED METHODS

(71) Applicant: SEMICONDUCTOR COMPONENTS INDUSTRIES, LLC, Phoenix, AZ (US)

(72) Inventors: Jeffrey Peter Gambino, Gresham, OR (US); Thomas F. Long, Gresham, OR (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/458,433

(22) Filed: Jul. 1, 2019

(65) Prior Publication Data
US 2021/0005566 A1 Jan. 7, 2021

(51) Int. Cl.
*H01L 23/00* (2006.01)
(52) U.S. Cl.
CPC .............. *H01L 24/17* (2013.01); *H01L 24/06* (2013.01); *H01L 24/11* (2013.01); *H01L 2224/175* (2013.01); *H01L 2924/01026* (2013.01); *H01L 2924/01027* (2013.01); *H01L 2924/01028* (2013.01)
(58) Field of Classification Search
CPC ......... H01L 24/17; H01L 24/06; H01L 24/11; H01L 2224/175; H01L 2924/01026; H01L 2924/01027; H01L 2924/01028

USPC .......................................................... 257/737
See application file for complete search history.

(56) References Cited

U.S. PATENT DOCUMENTS

| 5,346,775 A * | 9/1994 | Jin ........................... B23K 1/00 228/248.5 |
| 2016/0172299 A1* | 6/2016 | Noveski .............. H01L 23/3157 257/737 |
| 2019/0189338 A1* | 6/2019 | Kim ..................... H01F 27/2828 |

OTHER PUBLICATIONS

Calabro, et. al, "Magnetically Driven Three-Dimensional Manipulation and Inductive Heating of Magnetic-Dispersion containing Metal Alloys," Proceedings of the National Academy of Sciences of the United States of America, vol. 107, No. 11 (Mar. 16, 2010), pp. 4834-4839.
Habib, et. al., "Novel Solder-Magnetic Particle Composites and Their Reflow Using AC Magnetic Fields," IEEE Transactions on Magnetics, vol. 46, No. 6, Jun. 2010.
Li, et. al., "Preparation and Characterization of Silica Coated Iron Oxide Magnetic Nano-Particles," Spectrochimica Acta Part A, 76 (2010), 484-489.

* cited by examiner

*Primary Examiner* — Tong-Ho Kim
(74) *Attorney, Agent, or Firm* — Adam R. Stephenson, LTD.

(57) ABSTRACT

Implementations of semiconductor packages may include a first die including a plurality of contact pads, a second die including a plurality of contact pads, a plurality of solder interconnects bonding the plurality of contact pads of the first die to the plurality of contact pads of the second die, and a plurality of magnetic particles each coated in an oxide included in each of the plurality of solder interconnects.

20 Claims, 3 Drawing Sheets

SEMICONDUCTOR PACKAGE HAVING MAGNETIC INTERCONNECTS AND RELATED METHODS

BACKGROUND

1. Technical Field

Aspects of this document relate generally to semiconductor packages.

2. Background

Semiconductor die may be coupled together in a semiconductor package. Solder may be used to form connections within the semiconductor package. Solder may include a fusible metal alloy which may be melted and then cooled to adhere to a portion of the semiconductor package.

SUMMARY

Implementations of semiconductor packages may include a first die including a plurality of contact pads, a second die including a plurality of contact pads, a plurality of solder interconnects bonding the plurality of contact pads of the first die to the plurality of contact pads of the second die, and a plurality of magnetic particles each coated in an oxide included in each of the plurality of solder interconnects.

Implementations of semiconductor packages may include one, all, or any of the following:

The magnetic particles include either Ni, Co, Fe, $Fe_3O_4$ or any combination thereof.

A pitch of the plurality of solder interconnects may be less than 100 micrometers.

The plurality of contact pads of the first die may be bonded to the plurality of contact pads of the second die through an application of a magnetic field to the plurality of solder interconnects.

The plurality of magnetic particles may be more heavily concentrated near the second die than the first die.

The oxide may include silicon dioxide.

A method of forming a semiconductor package may include forming a plurality of solder interconnects on a first die. The plurality of solder interconnects may include magnetic particles in an oxide. Implementations of the method may also include coupling a second die over the first die, reflowing the plurality of solder interconnects, and applying a magnetic field to the plurality of solder interconnects to join the first die to the second die.

Implementations of a method of forming semiconductor packages may include one, all, or any of the following:

The magnetic particles may include either Ni, Co, Fe, $Fe_3O_4$, or any combination thereof.

The oxide may include silicon dioxide.

A pitch of the plurality of solder interconnects may be less than 100 micrometers.

The magnetic field applied may be between 100-1000 gauss.

The method may include cooling the plurality of solder interconnects while applying the magnetic field.

the solder interconnects may include 10-20% magnetic particles coated in an oxide, by volume.

A method of forming a semiconductor package may include forming a plurality of solder interconnects on a first die. The plurality of solder interconnects may include magnetic particles coated in an oxide. Implementations of the method may also include coupling a second die over the first die, reflowing the plurality of solder interconnects, and increasing a height of the plurality of solder interconnects by applying a magnetic field to the plurality of solder interconnects. The method may also include cooling the plurality of solder interconnects. The magnetic field may be applied during reflowing and cooling of the plurality of solder interconnects.

Implementations of a method of forming semiconductor packages may include one, all, or any of the following:

The magnetic particles may include either Ni, Co, Fe, $Fe_3O_4$, or any combination thereof.

The oxide may include silicon dioxide.

A pitch of the plurality of solder interconnects may be less than 100 micrometers.

The magnetic field applied may be between 100-1000 gauss.

Each of the magnetic particles may be between 0.1-1.0 micrometers long.

The solder interconnects may include 10-20% magnetic particles coated in the oxide, by volume.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
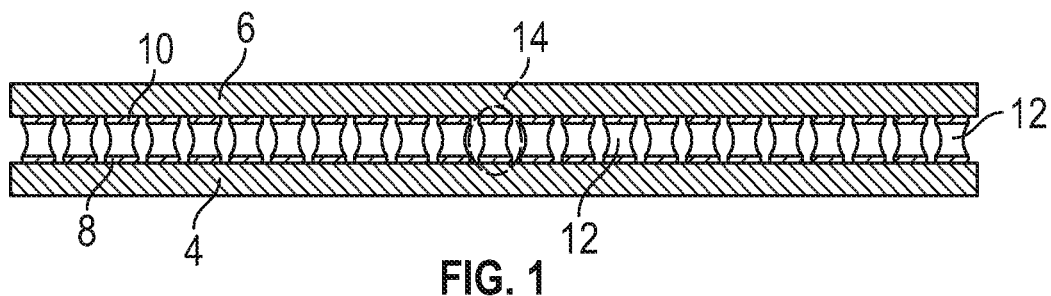
FIG. 1 is a side view of a first die bonded to a second die through a plurality of solder interconnects.

Referring to FIG. 1, a side view of a first die bonded to a second die through a plurality of solder interconnects is illustrated. In various implementations, the semiconductor package 2 may include a first die 4 coupled to a second die 6. The first die and the second die may be any type of semiconductor die including any type of various semiconductor devices in various implementations. In various implementations, the first die 4 may include a plurality of contact pads 8. The contact pads 8 include an electrically conductive material, and in various implementations, may include a metal and/or metal alloy. In particular implementations, the contact pads 8 may include, by non-limiting example, copper, aluminum, any other type of metal, any alloy thereof, or any combination thereof. In various implementations, the second die 6 may include a plurality of contact pads 10. The contact pads 10 of the second pad may be the same as or similar to any contact pads described herein.

Figure 2:
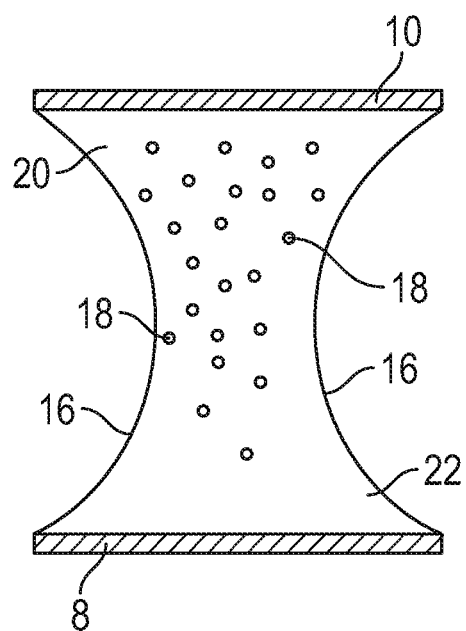
FIG. 2 is a magnified side view of a solder interconnect.

The semiconductor package includes a plurality of solder interconnects 12 coupled between the first die 4 and the second die 6. As illustrated by FIG. 1, the plurality of solder interconnects 12 bond the plurality of contact pads 8 of the first die 4 to the plurality of contact pads 10 of the second die 6. Referring to FIG. 2, a magnified side view of a solder interconnect is illustrated. As illustrated by FIG. 2, a single solder interconnect 14 of the plurality of solder interconnects 12 is illustrated coupled to one of the contact pads 8 of the first die 4 and one of the contact pads 10 of the second die 6. The solder interconnect 14 may be a representative example of the rest of the other solder interconnects of the plurality of solder interconnects 12 illustrated in FIG. 2. Accordingly, every solder interconnect of the plurality of solder interconnects 12 may be the same as or similar to the solder interconnect 14. As illustrated, the solder interconnect 14 may be directly coupled to the contact pads of the first die 4 and the second die 6. In various implementations, the solder interconnect 14 may include, by non-limiting example, a solder bump, ball, pad, pillar, or any other type of interconnect type. In various implementations, the solder interconnect 14 may include a pitch relative to the adjacent solder interconnections of less than 100 micrometers ($\mu m$). In other implementations, the solder interconnect 14 may include a height of 100 $\mu m$ or more. As illustrated, in various implementations the solder interconnect 14 may include an hour-glass shape having concave sidewalls 16. While the solder interconnect 14 is illustrated as symmetrical in FIG. 2, in other implementations one end of the solder interconnect may be larger and/or wider than the opposing end of the solder interconnect. In other implementations, the solder interconnect may include other various shapes which may be, by non-limiting example, substantially conical, cylindrical, pyramidal, cuboidal, or any other three-dimensional shape.

In various implementations the solder interconnect 14 may include a tin-based solder. In other implementations the solder interconnect 14 may include non-tin metal-based solders. As illustrated by FIG. 2, in various implementations the solder interconnect includes a plurality of magnetic particles 18 dispersed throughout the solder interconnect 14. As used herein, "magnetic" is defined as the property of a material capable of responding to a magnetic field. Accordingly, material that may be attracted/repulsed by a magnetic field is considered magnetic. In particular implementations, the magnetic particles 18 may be ferromagnetic. In various implementations, the magnetic particles 18 may be magnets and may produce/have their own permanent magnetic field. In various implementations, the magnetic particles may include, by non-limiting example, Ni, Co, Fe, $Fe_3O_4$, any combination thereof, or any other magnetic material alone or combination.

In various implementations, the magnetic particles 18 are coated in an oxide or other insulative material. In particular implementations, the oxide may include $SiO_2$, while in other implementations the oxide may include any other type of oxide. In implementations where the magnetic particles 18 are coated in an oxide, the oxide may prevent the magnetic particles from reacting with the solder. In such implementations, the addition of the magnetic particles coated in oxide may not affect the wetting properties and the reactivity of the solder due to the oxide acting as a barrier between the solder and the magnetic portions of the magnetic particles 18.

In various implementations the magnetic particles 18 (including the oxide coating) may include one or more diameters between about 0.1 $\mu m$ to about 1.0 $\mu m$. In particular implementations, all of the diameters of the magnetic particles 18 may be between 0.1 $\mu m$ and 1.0 $\mu m$. In other implementations, some or all of the diameters of the magnetic particles 18 may be 0.1 $\mu m$, less than 0.1 $\mu m$, 1.0 $\mu m$, or more than 1.0 $\mu m$. In various implementations the magnetic particles may make up between 1% to 30% of the volume of the solder interconnect 14. In particular implementations, the magnetic particles may make up between about 10%-20% of the volume of the solder interconnect 14. In other implementations, the magnetic particles may make up 1%, less than 1%, 30%, or more than 30% of the volume of the solder interconnect 14.

As illustrated by FIG. 2, in various implementations the magnetic particles 18 may be more heavily concentrated in the portion 20 of the solder interconnect 14 near the second die 6 than in the portion 22 of the solder interconnect near the first die. Such implementations may result from the application of a magnetic field closer to one die versus the other die.

In various implementations, the plurality of contact pads 8 of the first die 6 may be bonded to the plurality of contact pads 10 of the second die 6 while a magnetic field is applied to the plurality of solder interconnects 12. In such implementations, the magnetic particles 18 may react to/move under the influence of the magnetic field and ensure that the solder interconnects 12 fully contact the first die 4 and the second die 6. In such implementations, the magnetic field applied may be between 10 and 10,000 gauss, and in particular implementations, the magnetic field may be about 100-1000 gauss. In other implementations, a stronger or a weaker magnetic field may be applied.

In other implementations, rather than having distinct magnetic particles formed within the solder interconnect, the solder interconnect may include a magnetic alloy more magnetic than tin. In such implementations, the entire solder interconnect may react to/move under the influence of the applied magnetic field and ensure a bond between the first die and the second die, similar to the implementations disclosed herein.

Figure 3:
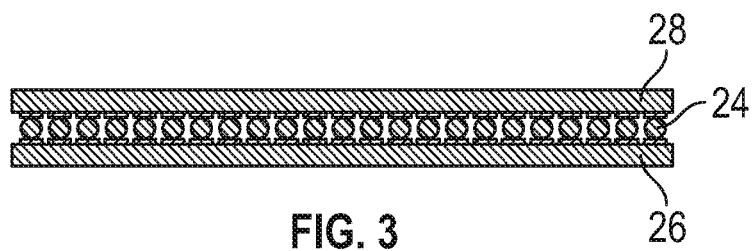
FIG. 3 is a side view of a plurality of solder interconnects between a first die and a second die.
Figure 4:
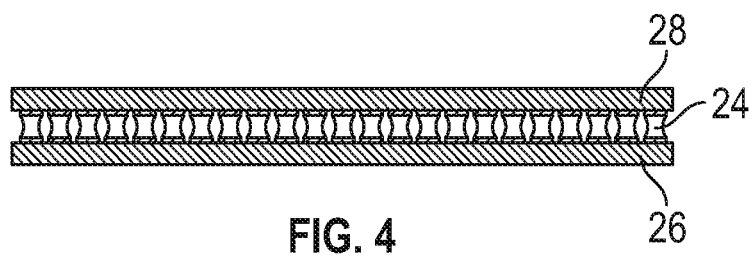
FIG. 4 is a side view of a first die bonded to a second die through a plurality of solder interconnects.

Referring to FIG. 3, a side view of a plurality of solder interconnects between a first die and a second die is illustrated. In various implementations, a method of forming a semiconductor package may include forming a plurality of solder interconnects 24 between a first die 26 and a second die 28. As illustrated by FIG. 3, all of the solder interconnects are in contact with the first die 26 and the second die 28. The method may also include reflowing the plurality of solder interconnects 24 and bonding the first die 26 to the second die 28 through each of the solder interconnects 24, as illustrated by FIG. 4, which illustrates a side view of a first die bonded to a second die through a plurality of solder interconnects. The solder interconnects may be reflowed through inductive heating in some implementations.

Figure 5:
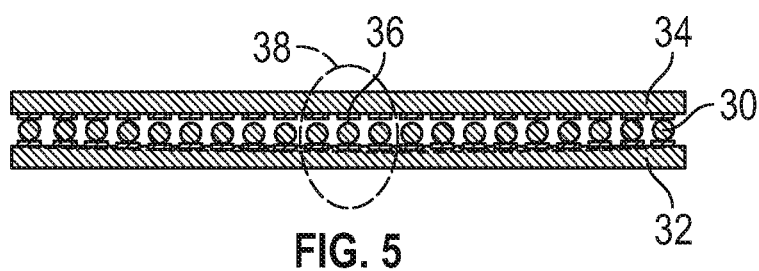
FIG. 5 is a side view of another implementation of a plurality of solder interconnects between a first die and a second die.
Figure 6:
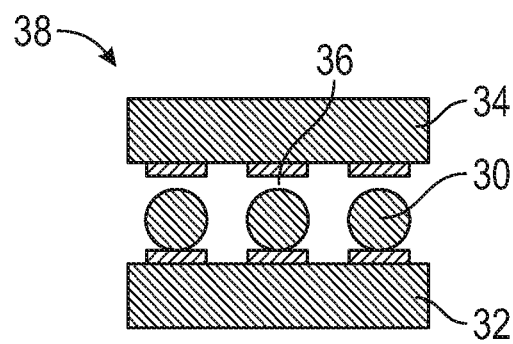
FIG. 6 is a magnified view of a portion of the solder interconnects of FIG. 5.
Figure 7:
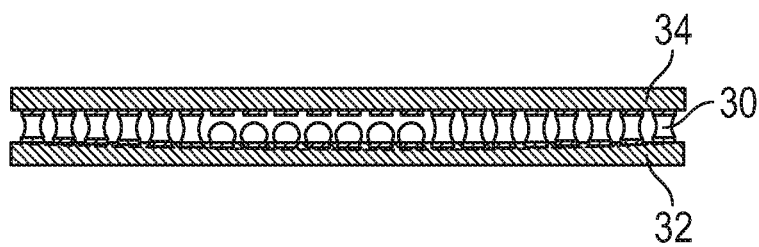
FIG. 7 is a side view of a first die partially bonded to a second die through a plurality of solder interconnects.

Referring to FIG. 5, a side view of another implementation of a plurality of solder interconnects between a first die and a second die is illustrated. In various implementations, similar to the implementation illustrated by FIG. 3, the method of forming a semiconductor package may include forming a plurality of solder interconnects 30 between a first die 32 and a second die 34. Unlike the implementation illustrated by FIG. 3, in various implementations a gap 36 may exist between one or more of the solder interconnects 30 and the second die 34. This gap 36 may be clearly seen in FIG. 6, which illustrates a magnified view of a portion 38 of the solder interconnects of FIG. 5. Referring to FIG. 7, a side view of a first die partially bonded to a second die through a plurality of solder interconnects is illustrated.

Various implementations of a method of forming the semiconductor package may include reflowing the solder interconnects 30. The solder interconnects 30 may be reflowed through inductive heating. In such implementations including a gap 36, or implementations where not all of the solder interconnects 30 contact the second die 34, upon reflowing, some of the solder interconnects but not all of the solder interconnects may bond the first die 32 to the second die. Accordingly, gaps between solder interconnects 30 and the second die 34 may persist even after reflowing of the solder interconnects. The implementation illustrated by FIGS. 5-7 may occur when bonding die with solder interconnects having a low pitch. When mass reflowing the solder interconnects, gaps may be present due to substrate and/or die warpage. In particular implementations, if the non-planarity of the two die exceeds 20% of the height of the solder interconnect, the gaps, or open solder interconnects, may ultimately exist in the semiconductor package causing electrical opens in the package and corresponding yield loss.

Figure 8:
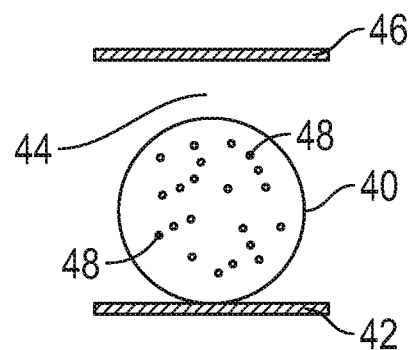
FIG. 8 is a side view of a single solder interconnect.

Similar to the method implementation illustrated by FIG. 5, in various implementations a method of forming a semiconductor package includes forming a plurality of solder interconnects on a first die and coupling a second die over the first die. In various implementations, the first and/or second die may include a plurality of contact pads which may be any type of contact pad disclosed herein. Referring to FIG. 8, a side view of a single solder interconnect is illustrated. In various implementations, the solder interconnect 40 may be representative of all or a portion of the plurality of solder interconnects between a first die and a second die. As illustrated, the solder interconnect 40 may be directly coupled to a contact pad 42 of a first die. In various implementations, a gap 44 may separate the solder interconnect 40 from the second die and/or a contact pad 46 of the second die. The solder interconnect 40 may be any type of solder interconnect disclosed herein, including any shape, size, or material disclosed herein. Further, the solder interconnect 40 may include magnetic particles 48 coated in an oxide or other insulative layer. The magnetic particles 48 and insulative layer may be any type of magnetic particle or insulative layer (including oxides) disclosed herein. Accordingly, the magnetic portion of the magnetic particle may be prevented from reacting with the solder due to the oxide (or other insulative) barrier.

Figure 9:
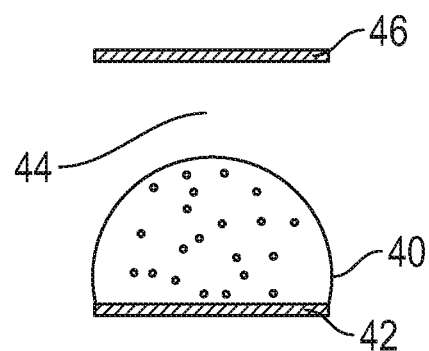
FIG. 9 is a side view of a single reflowed solder interconnect.

Referring to FIG. 9, a side view of a single reflowed solder interconnect is illustrated. In various implementations, the method of forming a semiconductor package may include reflowing the plurality of solder interconnects, including solder interconnect 40. In various implementations, the solder interconnect 40 may be reflowed through inductive heating. The solder interconnect 40 may become molten solder upon reflowing the interconnect. In various implementations, the gap 44 may persist between the solder interconnect 40 and the second die and/or contact pad 46 upon reflowing the solder interconnect.

Figure 10:
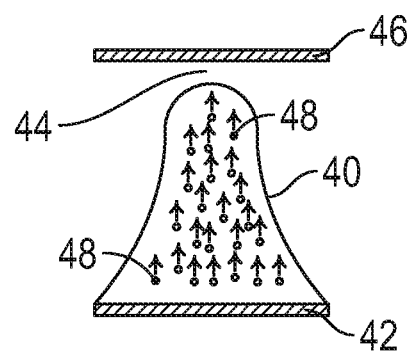
FIG. 10 is a side view of the single reflowed solder interconnect influenced by a magnetic field.

Referring to FIG. 10, a side view of the single reflowed solder interconnect influenced by a magnetic field is illustrated. In various implementations, the method may include applying a magnetic field to the plurality of solder interconnects while in their molten and/or semi-liquid state, including the solder interconnect 40, to increase the height of the solder interconnects having a gap and to join the first die to the second die. As illustrated by FIG. 10, when a magnetic field with an opposite polarity to that of the magnetic particles in the solder is applied to the solder interconnect 40, the magnetic particles 48 within the molten solder are pulled towards the second die and/or the contact pad 46 of the second die. By applying the magnetic field, the solder interconnect 40 is forced to close the gap 44 between the solder interconnect and the second die and/or contact pad 46. In various implementations, the magnetic field applied is between about 100-1000 gauss. In other implementations, the magnetic field applied may be 100, less than 100, 1000, or more than 1000 gauss. In various implementations, the magnetic field is applied only after the solder interconnects have been reflowed. In other implementations, the magnetic field is applied during the reflow process.

Figure 11:
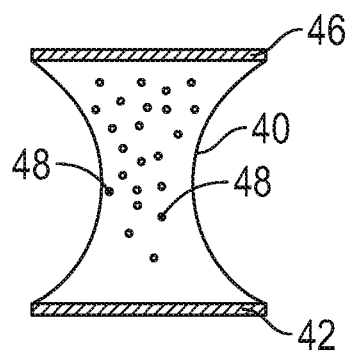
FIG. 11 is a side view of a single reflowed solder interconnect bonding a first pad to a second pad.

Referring to FIG. 11, a side view of a single reflowed solder interconnect bonding a first pad to a second pad is illustrated. As illustrated, the solder interconnect 40 bonds the first die and/or contact pad 42 to the second die and/or contact pad 46. The final solder interconnect formed may include any shape and/or size of solder interconnects disclosed herein. In various implementations, the method of forming a semiconductor package includes cooling the solder interconnect to ensure that it holds its elongated form. In such implementations, the method may also include continually applying the magnetic field during the cooling of the plurality of solder interconnects. In this manner, the solder interconnects may maintain their position and shape while they harden.

In other implementations, the magnetic field with the same polarity as the magnetic particles in the solder may be applied from beneath the second die, causing the magnetic particles to be repelled toward the second die. In such implementations, a structure with the similar appearance and distribution of solder particles to the one illustrated in FIG. 11 will result.

As illustrated by FIG. 11, as a result of the applied magnetic field, the magnetic particles 48 may be more concentrated near the contact pad 46 of the second die as compared to the contact pad 42 of the first die. In the methods disclosed herein including applying the magnetic field, mass reflow of solder interconnects having a pitch/height of less than 100 μm is possible. Accordingly, even if one or more gaps exist between one or more solder interconnects and the second die, the solder interconnects may all still form complete connections between the solder interconnects and the second die due to solder flow induced by the magnetic particles.

While the implementations disclosed herein refer to two die being bonded together through a plurality of solder interconnects, the same methods may be applied to bond two substrates and/or wafers and/or two panels through a plurality of solder interconnects. In other implementations, the same methods disclosed herein may be applied to solder die attach techniques.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A semiconductor package comprising:
a first die comprising a plurality of contact pads;
a second die comprising a plurality of contact pads;
a plurality of solder interconnects bonding the plurality of contact pads of the first die to the plurality of contact pads of the second die; and
a plurality of magnetic particles each coated in an oxide comprised in each of the plurality of solder interconnects.

2. The package of claim 1, wherein the plurality of magnetic particles comprise Ni, Co, Fe, $Fe_3O_4$, or any combination thereof.

3. The package of claim 1, wherein a pitch of the plurality of solder interconnects is less than 100 micrometers.

4. The package of claim 1, wherein the plurality of contact pads of the first die are bonded to the plurality of contact pads of the second die through an application of a magnetic field to the plurality of solder interconnects.

5. The package of claim 1, wherein the plurality of magnetic particles is more heavily concentrated near the second die than the first die.

6. The package of claim 1, wherein the oxide comprises silicon dioxide.

7. A method of forming a semiconductor package comprising:
forming a plurality of solder interconnects on a first die, wherein the plurality of solder interconnects comprise magnetic particles coated in an oxide;
coupling a second die over the first die;
reflowing the plurality of solder interconnects; and
applying a magnetic field to the plurality of solder interconnects to join the first die to the second die.

8. The method of claim 7, wherein the magnetic particles comprise Ni, Co, Fe, $Fe_3O_4$, or any combination thereof.

9. The method of claim 7, wherein the oxide comprises silicon dioxide.

10. The method of claim 7, wherein a pitch of the plurality of solder interconnects is less than 100 micrometers.

11. The method of claim 7, wherein the magnetic field applied is between 100-1000 gauss.

12. The method of claim 7, further comprising cooling the plurality of solder interconnects while applying the magnetic field.

13. The method of claim 7, wherein the solder interconnects comprise 10-20% magnetic particles coated in an oxide, by volume.

14. A method of forming a semiconductor package comprising:
forming a plurality of solder interconnects on a first die, wherein the plurality of solder interconnects comprise magnetic particles coated in an oxide;
coupling a second die over the first die;
reflowing the plurality of solder interconnects;
increasing a height of the plurality of solder interconnects by applying a magnetic field to the plurality of solder interconnects; and
cooling the plurality of solder interconnects, wherein the magnetic field is applied during reflowing and cooling of the plurality of solder interconnects.

15. The method of claim 14, wherein the magnetic particles comprise Ni, Co, Fe, $Fe_3O_4$, or any combination thereof.

16. The method of claim 14, wherein the oxide comprises silicon dioxide.

17. The method of claim 14, wherein a pitch of the plurality of solder interconnects is less than 100 micrometers.

18. The method of claim 14, wherein the magnetic field applied is between 100-1000 gauss.

19. The method of claim 14, wherein each of the magnetic particles is between 0.1-1.0 micrometers long.

20. The method of claim 14, wherein the plurality of solder interconnects comprise 10-20% magnetic particles coated with the oxide, by volume.

* * * * *